(12) United States Patent
Crittenden

(10) Patent No.: US 9,714,965 B2
(45) Date of Patent: Jul. 25, 2017

(54) SYSTEM FOR MEASURING CONTACT FORCE IN A UTILITY METER

(71) Applicant: Aclara Meters LLC, Hazelwood, MO (US)

(72) Inventor: Curtis Whitmore Crittenden, Dover, NH (US)

(73) Assignee: Aclara Meters, LLC, St. Louis, MO (US)

( * ) Notice: Subject to any disclaimer, the term of this patent is extended or adjusted under 35 U.S.C. 154(b) by 120 days.

(21) Appl. No.: 14/600,413

(22) Filed: Jan. 20, 2015

(65) Prior Publication Data

US 2016/0209464 A1 Jul. 21, 2016

(51) Int. Cl.
| | |
|---|---|
| *G01R 1/04* | (2006.01) |
| *G01R 22/06* | (2006.01) |
| *G01R 31/28* | (2006.01) |
| *G01R 31/04* | (2006.01) |
| *G01D 4/00* | (2006.01) |
| *G01D 4/02* | (2006.01) |
| *G01L 5/00* | (2006.01) |

(52) U.S. Cl.
CPC ............ *G01R 22/068* (2013.01); *G01D 4/00* (2013.01); *G01D 4/02* (2013.01); *G01L 5/0057* (2013.01); *G01R 1/0416* (2013.01); *G01R 31/045* (2013.01); *G01R 31/2891* (2013.01)

(58) Field of Classification Search
CPC ................................ G01R 22/068; G01L 1/18
See application file for complete search history.

(56) References Cited

U.S. PATENT DOCUMENTS

| | | | |
|---|---|---|---|
| 3,388,590 A | 6/1968 | Dryden | |
| 5,334,057 A * | 8/1994 | Blackwell | ............ H01R 13/112 439/839 |
| 6,766,698 B1 | 7/2004 | Robinson et al. | |
| 2008/0116906 A1 | 5/2008 | Martin et al. | |
| 2013/0048479 A1* | 2/2013 | Paulus | ..................... H01H 9/56 200/181 |

FOREIGN PATENT DOCUMENTS

| | | |
|---|---|---|
| DE | 4003552 A1 | 8/1991 |
| JP | 2007149517 A * | 6/2007 |

OTHER PUBLICATIONS

European Search Report for Application No. 16151753.7 mailed Jun. 20, 2016.

* cited by examiner

*Primary Examiner* — Kristal Feggins
*Assistant Examiner* — Kendrick Liu
(74) *Attorney, Agent, or Firm* — Polster, Lleder, Woodruff & Lucchesi, LC

(57) ABSTRACT

The present disclosure relates to a system and method for evaluating the adequacy of a connection between a utility line and a utility meter. In one embodiment, a force sensing unit is disposed between a first half and a second half of a first terminal of the utility meter and is configured to measure a contact force between the first terminal and a socket jaw.

4 Claims, 6 Drawing Sheets

SYSTEM FOR MEASURING CONTACT FORCE IN A UTILITY METER

BACKGROUND

The subject matter disclosed herein relates to a system and method for evaluating the adequacy of a connection between a utility line and a utility meter.

Utility meters are typically installed in meter sockets that are connected to a utility supply line and a customer load line. When a utility meter (e.g., electricity meter) is installed in the meter socket, electricity (e.g., electric power) is delivered from the utility supply line to the customer load line through the utility meter. The utility meter can measure a flow rate of the electricity, and thus the amount of electricity consumed by the customer. Over time, the quality of the connection between the utility meter and the meter socket may degrade, such that the operability of the meter is impaired. Therefore, a reliable technique and/or device for testing the connection between the utility meter and the meter socket is desirable.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In a first embodiment, a system is configured to measure an amount of electricity consumed by a load, and includes a utility meter, a socket jaw, and a force sensing unit. The utility meter includes a first terminal, and the first terminal has a first half and a second half. The socket jaw includes a first blade and a second blade, which are configured to receive the first terminal. The force sensing unit is disposed between the first half and the second half of the first terminal. The force sensing unit is configured to measure a contact force between the first blade and the first terminal.

In a second embodiment, a test device is configured to assess an adequacy of a contact force. The test device includes a first terminal, wherein the first terminal is configured to be received by a socket jaw comprising a first blade and a second blade. The test device also has a force sensing unit disposed between a first side and a second side of the first terminal, wherein the force sensing unit is configured to measure a contact force between the first blade and the first terminal. Additionally, the test device includes a display configured to display a visualization of the contact force.

In a third embodiment, a method for disconnecting a flow of electrical current through a utility meter includes receiving a contact force value between a first blade of a socket jaw and a first terminal of the utility meter from a clamp-force detector, wherein the socket jaw is configured to receive the utility meter. The method also includes determining whether the contact force value is below a threshold value. Finally, a signal is sent to a service switch when the contact force value is below the threshold value. The service switch is configured to disconnect the flow of electrical current when the signal is received by the service switch.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
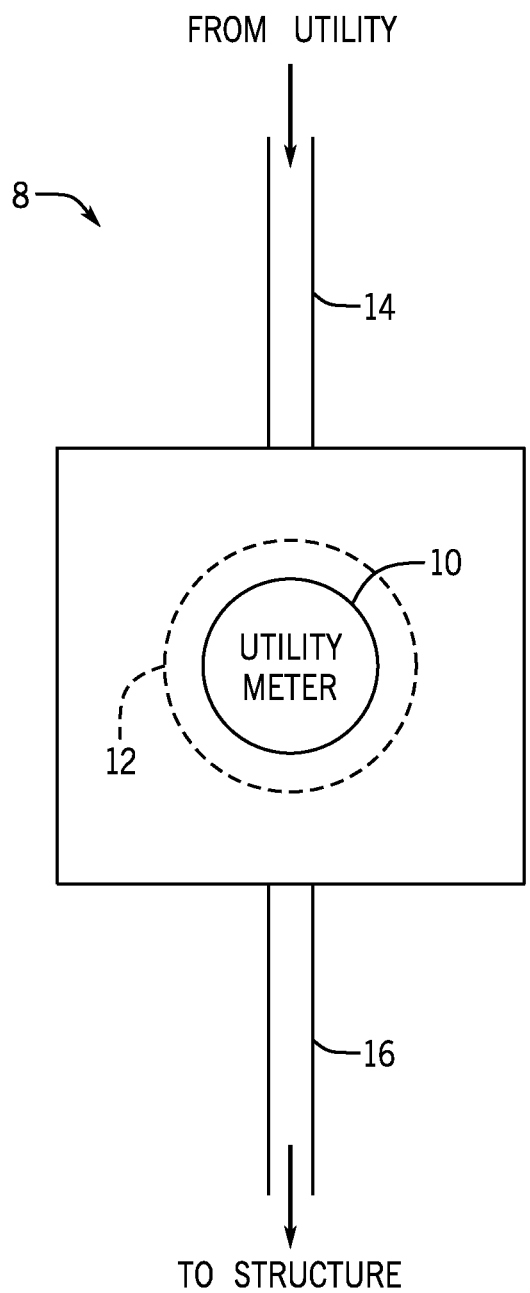
FIG. 1 illustrates a block diagram of a utility meter connected to socket jaws in a meter socket, in accordance with embodiments presented herewith.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Electrical utility meters may record consumption of electric energy (e.g., electricity) over intervals of time and communicate the recorded information back to a utility company providing the electricity. As such, utility meters may enable a utility company, such as an electricity provider, to remotely monitor a consumer's use of the utility. However, various components disposed within the utility meter to monitor usage or provide additional functionalities may, over time, become damaged or worn due to corrosion, misuse, or other external factors. For example, utility meters may connect to a supply line and a load line via socket jaws. When terminals of a utility meter are secured in the socket jaws an electrical connection may be established between the supply line and the load line through the utility meter. When the socket jaws are coupled to the contact terminals of the utility meter (e.g., electricity meter), a clamping force between the socket jaws and the contact terminals should be adequate to provide a secure, low-resistance electrical connection between the socket jaws and the contact terminals.

However, socket jaws may become damaged or worn over time. An impaired socket jaw may fail to provide the contact force sufficient to make a low-resistance electrical connection with the utility meter. Typically, a damaged socket jaw cannot be diagnosed by visual inspection. Moreover, measuring the force used to insert or remove a utility meter from a socket jaw does not provide a reliable estimate of socket jaw health because surface finish, lubrication, blade chamfer, or other factors may distort the measurement. Additionally, the insertion or removal force measurement cannot be acquired while the utility meter is installed in the meter socket (e.g., in situ). Since a utility provider may not be immediately aware of a situation where a component (e.g., socket jaw) needs to be replaced, it is desirable to have a system and/or method for detecting when a utility meter component (e.g., socket jaws) is defective and requires replacement.

Certain embodiments of the present disclosure propose to detect defective socket jaws in-situ. For example, a device may be embedded directly in a utility meter terminal or a socket jaw such that a quality of an electrical connection between the meter and the utility may be determined. The device may be a force sensing unit that measures a contact force between a blade of the socket jaw and a terminal of the utility meter. For example, the force sensing unit could be disposed between two halves of the terminal of the utility meter such that when the terminal is secured between the blades of the socket jaw, the force sensing unit may be subjected to an applied force. Alternatively, the force sensing unit may be disposed on a blade of the socket jaw such that when a terminal of the utility meter is secured in the socket jaw, the force sensing unit can measure the contact force. In certain embodiments, the force sensing unit may send a signal corresponding to the contact force between the blade of the socket jaw and the terminal of the utility meter to a processor or directly to a utility provider. For example, the force sensing unit may send the signal to a utility provider, such that the utility provider may monitor the electrical connection between the meter and the utility remotely.

With the foregoing in mind, FIG. 1 illustrates a block diagram of a utility meter system 8 that includes a utility meter 10 connected to a meter socket 12. The meter socket 12 includes connections to a utility supply line 14 and a load line 16. Therefore, after the utility meter 10 is inserted into the meter socket 12, electricity from the utility supply line 14 may flow through the utility meter 10 and to the load line 16. In certain embodiments, the load line 16 may provide electricity to a structure (e.g., a load), such as a residence or a commercial building. The amount of electricity consumed by the structure can then be measured by the utility meter 10.

Figure 2:
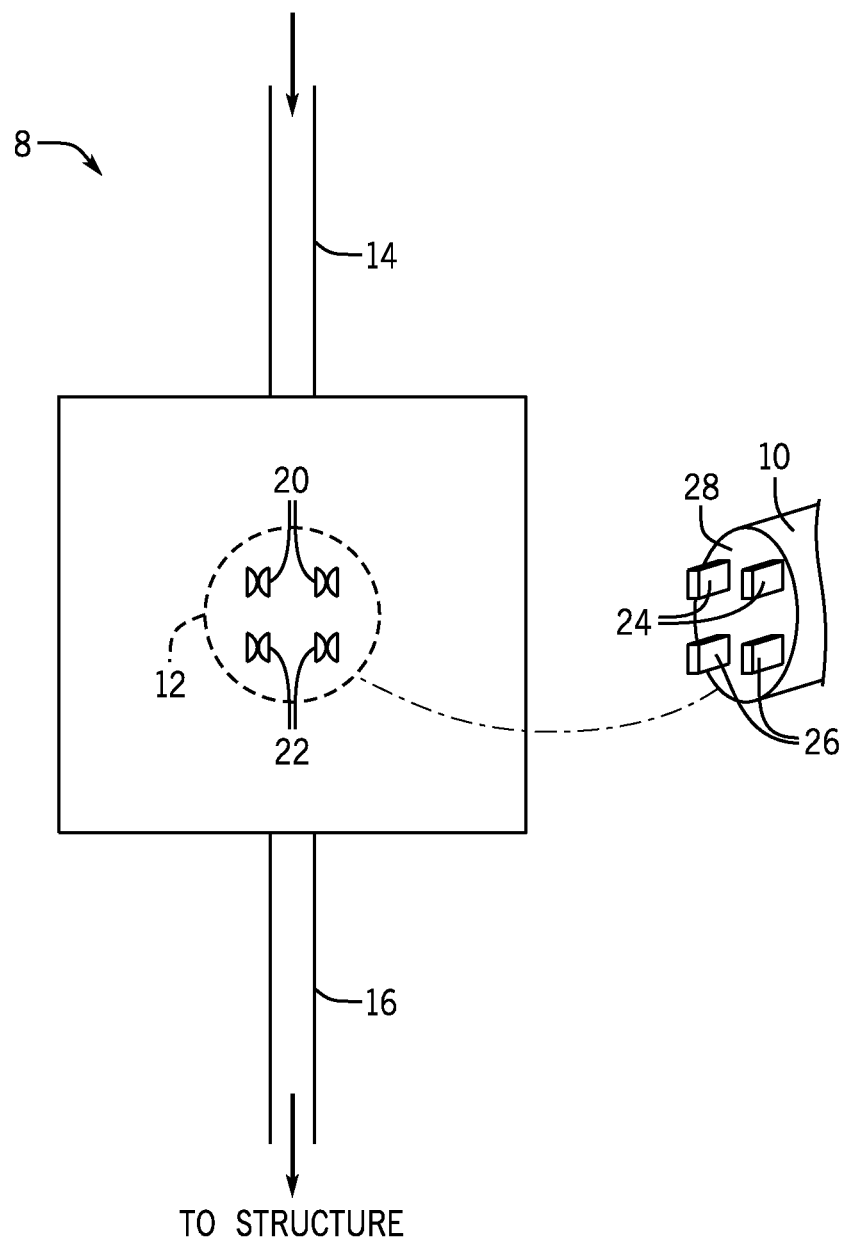
FIG. 2 illustrates a block diagram of how the utility meter of FIG. 1 is connected to the socket jaws of FIG. 1, in accordance with embodiments presented herewith.

FIG. 2 illustrates a block diagram that details how the utility meter 10 of FIG. 1 is connected to the meter socket 12 of FIG. 1. The meter socket 12 may include pairs of socket jaws 20 and 22. The socket jaws 20, 22 may serve as clamps that secure corresponding pairs of terminals 24 and 26 of the utility meter 10 to the meter socket 12. The terminals 24, 26 may be disposed on a base 28 of the utility meter 12. In certain embodiments, the meter socket 12 may include any number of socket jaws 20, 22. In the same manner, the utility meter 10 may include any number of terminals 24, 26.

The socket jaws 20, 22 create an electrical connection between the utility meter 10, the utility supply line 14, and the load line 16. For example, in one embodiment, a first pair of socket jaws 20 may be electrically coupled to the utility supply line 14 and a second pair of socket jaws 22 may be electrically coupled to the load line 16. However, it should be noted that the first pair of socket jaws 20 and the second pair of socket jaws 22 are coupled to each other via a relay, a service switch, or the electrical line. As such, when the utility meter 10 is inserted into the meter socket 12, the terminals 24, 26 come into contact with the socket jaws 20, 22, thereby establishing an electrical connection between the utility supply line 14 and the load line 16 via the utility meter 10. To ensure that electricity efficiently flows through the utility meter 10, a sufficient contact force between the socket jaws 20, 22 and the contact terminals 24, 26 should be maintained.

Figure 3:
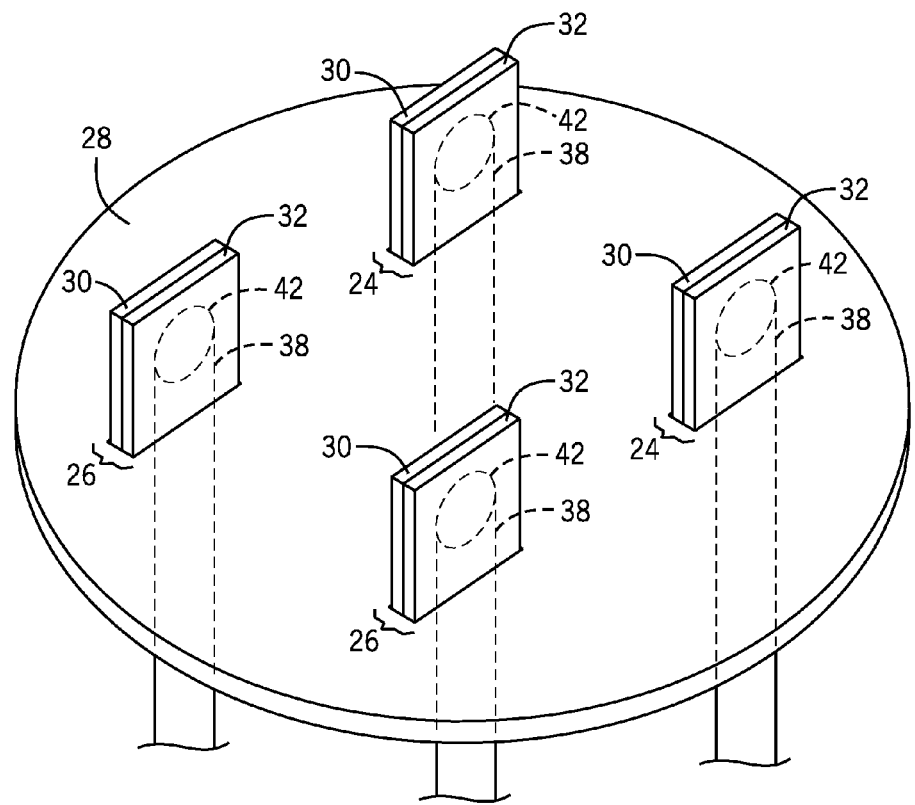
FIG. 3 illustrates a top view of a utility meter base that includes terminals with a force sensing unit disposed between two halves of each terminal, in accordance with embodiments presented herewith.

Referring now to FIG. 3, a top view of the utility meter base 28 and the terminals 24, 26 is illustrated. The utility meter base 28 may include the first pair of terminals 24 and the second pair of terminals 26. Each terminal 24, 26 may further include a first half 30 and a second half 32. The first half 30 and the second half 32 may both be constructed from conductive metals such that the terminals 24, 26 may establish an electrical connection between the utility supply line 14 and the load line 16 when disposed in the socket jaws 20, 22. In certain embodiments, force sensing units 38 may be disposed between the first half 30 and the second half 32, as shown in FIG. 3. However, it should be noted that in other embodiments, the force sensing units 38 may be placed between blades of the socket jaws 20, 22. In either case, the force sensing unit 38 may measure a force between the socket jaws 20, 22 and the terminals 24, 26 of the utility meter 10 when the terminal 24, 26 is secured between the blades of the socket jaws 20, 22.

The force sensing units 38 may be fastened to the first half 30 of the terminals 24, 26 with an adhesive or other any other form of fastener. Alternatively, the force sensing units 38 may be fastened to the second half 32, a first blade of the socket jaws 20, 22, and/or a second blade of the socket jaws 20, 22 using an adhesive or other form of fastener. In certain embodiments the force sensing units 38 may include sensors 42. The sensors 42 may be a portion of the force sensing units 38 that measure changes in an applied force. The sensors 42 may be any size and shape and may measure a contact force between the socket jaws 20, 22 and a respective terminal 24, 26 when the terminal is secured between the blades of the socket jaws 20, 22.

In certain embodiments, the force sensing units 38 may be piezoresistive force sensors. A piezoresistive force sensor experiences changes in conductance in proportion to an applied force. Therefore, as the contact force between the blades of the socket jaws 20, 22 and the terminals 24, 26 decreases, the conductance of the piezoresistive force sensor may also decrease. In alternate embodiments, the conductance of the piezoresistive force sensor may be inversely proportional to the contact force. As a non-limiting example, the piezoresistive force sensor may be a FlexiForce® sensor manufactured by Tekscan®. In other embodiments, other types of force sensors may be utilized such as force sensing resistors, film load cells, membrane potentiometers, or any other device that measures a change in an applied force between two objects.

Figure 4:
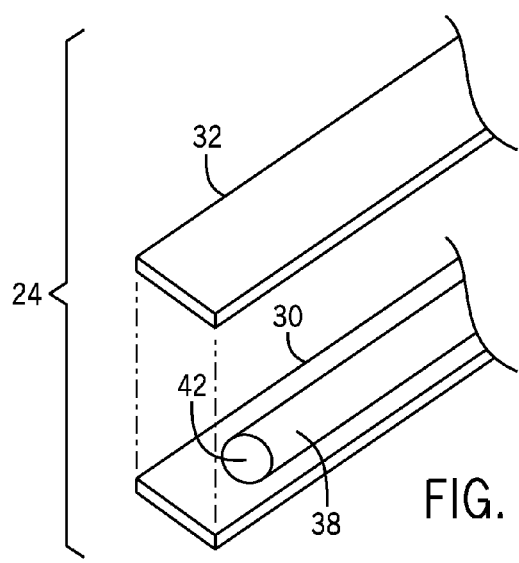
FIG. 4 illustrates an exploded view of one of the terminals of FIG. 3 with the force sensing unit disposed between the two halves, in accordance with embodiments presented herewith.

FIG. 4 illustrates an exploded view of the terminal 24 of FIG. 3 with the force sensing unit 38 disposed between the two halves 30, 32. As shown, the force sensing unit 38 is fastened to the first half 30 of the terminal 24, however, in other embodiments, the force sensing unit 38 may be fastened to the second half 32. The first half 30 and the second half 32 may be coupled to one another by screws, adhesives, clamps, or any other mechanism that may couple the first half 30 to the second half 32. When coupled together, the first half 30 and the second half 32 may be substantially the same size as a standard utility meter terminal, such that the first half 30 and the second half 32 fit into a socket jaw 20, 22 of the meter socket.

In certain embodiments, the first half 30 and the second half 32 may be coupled such that the force sensing unit 38 is not subject to an applied force between the first half 30 and the second half 32 when the terminal 24 is not secured by the socket jaws 20, 22. In certain embodiments, when the first half 30 and the second half 32 are coupled, a gap may be present between the first half 30 and the second half 32 to house the force sensing unit 38, such that no force is exerted on the force sensing unit 38. However, the force sensing unit 38 may measure a clamping force when the terminal 24 is secured between the blades of the socket jaws 20, 22. The blades of the socket jaws 20, 22 may exert a force on the first half 30 and the second half 32 of the terminal 24. The force exerted by the blades of the socket jaws 20, 22 may close the gap between the first half 30 and the second half 32, thereby enabling the first half 30 to exert a force equal to the force exerted by the socket jaws 20, 22 on the second half 32. Therefore, the force sensing unit 38 becomes subject to the force exerted by the first half 30 on the second half 32, such that it can measure the contact force between the terminal 24 and the socket jaws 20, 22.

In other embodiments, no gap may form between the first half 30 and the second half 32 when the first half 30 and the second half 32 are coupled to one another. In this case, the force sensing unit 38 may be calibrated or normalized to measure additional force applied on the force sensing unit 38, but not the force due to the two halves 30, 32.

Figure 5:
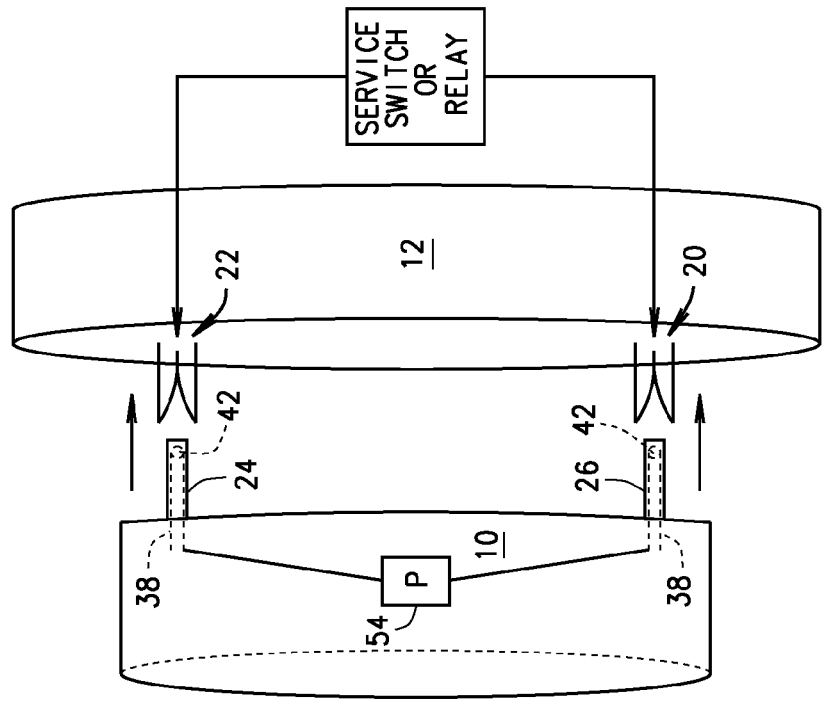
FIG. 5 illustrates a side view of a utility meter aligned with socket jaws of a meter socket, in accordance with embodiments presented herewith.

FIG. 5 illustrates a side view of the utility meter 10 aligned with the socket jaws 20, 22 of the meter socket 12. The terminals 24, 26 of the utility meter are positioned to fit into the socket jaws 20, 22 of the meter socket 12, thereby creating an electrical connection between the utility supply line 14 and the load line 16. In certain embodiments, the force sensing unit 38 may be disposed on the first half 30 of the terminals 24, 26 such that the force sensing unit 38 is between the first half 30 and the second half 32 of the terminals 24, 26. Therefore, the force sensing unit 38 may be enclosed by the terminals 24, 26 such that it cannot be seen when the first half 30 is coupled to the second half 32. Additionally, the force sensing unit 38 may be disposed on the first half 30, such that the sensor 42 is positioned substantially near a location where the blades of the socket jaws 20, 22 and the terminals 24, 26 contact each other. In other words, the sensor 42 is positioned, such that it can measure the contact force between the socket jaws 20, 22 and the terminals 24, 26. Alternatively, in certain embodiments the force sensing unit 38 may be disposed along a blade of the socket jaws 20, 22 rather than on the first half 30 of the terminals 24, 26.

In certain embodiments, the force sensing unit 38 may be electronically coupled to a processor 54. The processor may be disposed within the utility meter 10. The force sensing unit 38 may send a signal corresponding to a contact force value between the socket jaws 20, 22 and the terminals 24, 26 to the processor. The processor 54 will be described in greater detail with reference to FIGS. 7 and 8.

Figure 6:
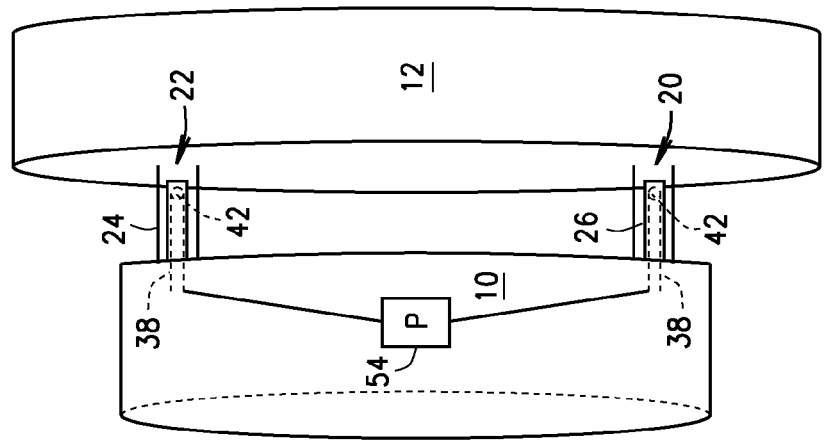
FIG. 6 illustrates a side view of the utility meter of FIG. 4 secured in the socket jaws of the meter socket of FIG. 4, in accordance with embodiments presented herewith.

FIG. 6 illustrates a side view of the utility meter 10 secured in the socket jaws 20, 22 of the meter socket 12. As shown in FIG. 6, the terminals 24, 26 of the utility meter 10 may be placed between two blades of the socket jaws 20, 22. Upon placement between the blades of the socket jaws 20, 22, the force sensing unit 38 may measure the contact force between the terminals 24, 26 and the blades of the socket jaws 20, 22. It should be understood by those with skill in the art that the force sensing unit 38 could be disposed on any of the blades of the socket jaws 20, 22, as well as on either the first half 30 or the second half 32 of the terminals 24, 26. By installing a force sensing unit 38 within the utility meter 10 terminals 24, 26, a utility company may remotely and continuously monitor the contact force between the socket jaws 20, 22 the terminals 24, 26 of the utility meter 10 to ensure a proper electrical connection is being maintained between the two.

In certain embodiments, the force sensing unit 38 may be electronically coupled to the processor 54. The processor may be disposed within the utility meter 10. The force sensing unit 38 may send a signal corresponding to a contact force between the socket jaws 20, 22 and the terminals 24, 26 to the processor. The processor 54 will be described in greater detail with reference to FIGS. 7 and 8.

Figure 7:
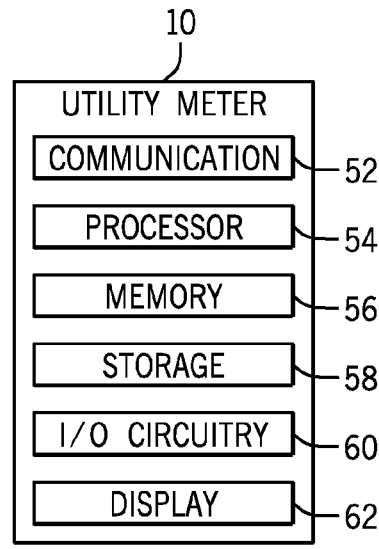
FIG. 7 illustrates a block diagram of components of the utility meter, in accordance with embodiments presented herewith.

FIG. 7 illustrates a block diagram of components of the utility meter 10. In certain embodiments, the utility meter 10 may receive measurements or data from the force sensing unit 38 and send the measurements to the utility provider. To perform these operations, the utility meter 10 may include a communication component 52, the processor 54, a memory device 56, a storage component 58, input/output (I/O) circuitry 60, and a display component 62.

The utility meter may include the processor 54 (e.g., a general purpose microprocessor, an application-specific integrated circuit (ASIC), or other suitable processing circuitry) that may be capable of executing instructions (e.g., executable applications, modules, routines, firmware, and so forth) to provide the desired functionality of the utility meter 50. The processor 54 may receive data from at least the force sensing unit 38 via the communication component 52. The communication component 52 may be any device capable of receiving data, whether through a wireless or wired connection. In certain embodiments, the data may be the contact force measurement between the socket jaws 20, 22 and the terminals 24, 26. In other embodiments, the data may be a conductance signal from the force sensing unit 38 corresponding to the contact force. In certain embodiments, the processor 54 may perform a conversion of the conductance to a contact force value.

Additionally, the utility meter 10 may have a memory device 56. The memory device 56 may include a volatile memory, such as random access memory (RAM), and/or a nonvolatile memory, such as ROM. The memory device 56 may store a variety of information and may be used for various purposes. For example, the memory device 56 may store processor-executable instructions (e.g., firmware or software) for the processor 54 to execute, such as instructions for displaying an output based on the data received from the force sensing unit 38. The utility meter 10 may also include a storage device(s) 58 (e.g., nonvolatile storage), which may include read-only memory (ROM), flash memory, a hard drive, or any other suitable optical, magnetic, or solid-state storage medium, or a combination thereof. The storage device(s) 58 may store data (e.g., contact forces over time), instructions (e.g., software or firmware for displaying an output, or the like), and any other suitable data.

The utility meter 10 may also include I/O circuitry 60 capable of receiving user input via one or more input devices (e.g., touchscreens, pointing devices, keyboards, microphones, accelerometers, and so forth) and/or providing output to the user via one or more displays 62 (e.g., touchscreens, speakers, indicator lights, printers, and so forth). The components included in the illustrated utility meter 10 are merely provided as examples, and other embodiments of the utility meter 10 may include additional or fewer components, in accordance with the present disclosure.

Figure 8:
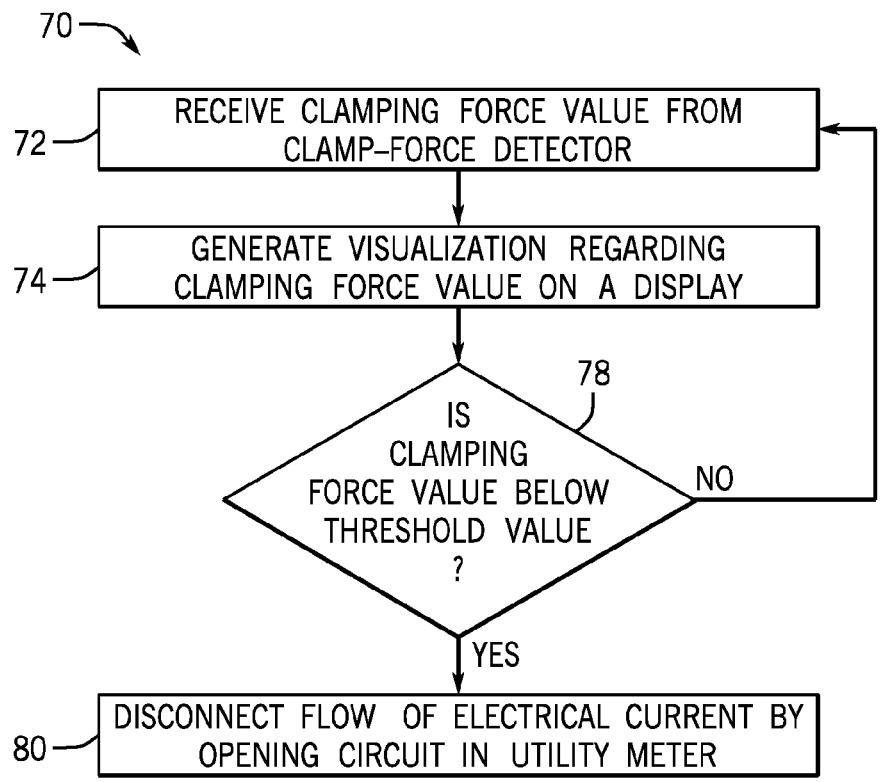
FIG. 8 illustrates a flow chart for controlling an operation of a utility meter based on contact force data, in accordance with embodiments presented herewith.

FIG. 8 illustrates a flow chart 70 for controlling an operation of the utility meter 10 based on contact force data. At block 72, the processor 54 may receive a contact force value from a clamp-force detector. The clamp-force detector may be the force sensing unit 38, or some other device that is configured to measure the amount of force between the socket jaws 20, 22 and the terminals 24, 26 of the utility meter 10.

At block 74, the processor 54 may, in certain embodiments, generate a visualization regarding a contact-force value on a display 76. Embodiments of the display 76 will be described more fully with reference to FIGS. 9 and 10 below.

At block 78, the processor 54 may determine whether the contact force value received by the processor 54 is below a threshold value. The threshold value may be a force determined to be minimally sufficient for a reliable electrical connection. For example, the threshold value may be approximately 225 Newtons ("N"). However, it should be understood that the threshold value may depend on a variety of factors, such as the material of the terminal, the material of the socket jaw blades, the amount of electric power being transferred through the utility meter, among others. Therefore, depending on the properties of the terminal and the socket jaw, the threshold value may be more or less than 225 Newtons. If the contact force value received by the processor 54 is not below the threshold value, then the processor 54 may return to block 72 and continue to receive contact force values and generate a visualization regarding the received contact force values, as described above with respect to block 72 and block 74.

However, if the received contact force value is below the threshold value, then the processor 54 may proceed to block 80. At block 80, the processor 54 may send a command to the utility meter 10 to open a circuit that connects the utility supply line 14 to the load line 16, such that electricity cannot flow from the utility supply line 14 to the load line 16. In certain embodiments, the utility meter 10 may include a service switch that may open and close the circuit. When the contact force value is below the threshold value, the processor 54 may send a command to change a position of the service switch from a closed circuit position to an open circuit position (e.g., via an actuator), such that electricity cannot flow from the supply line 14 to the load line 16. In alternate embodiments, the processor 54 may, in addition to or in lieu of disconnecting a flow of electricity, generate a signal to be received by a utility company alerting the company that the contact force may be insufficient. Further, some embodiments may also display to an observer of the utility meter 10 that the contact force is insufficient through display 76, display 94, or a combination of both.

Figure 9:
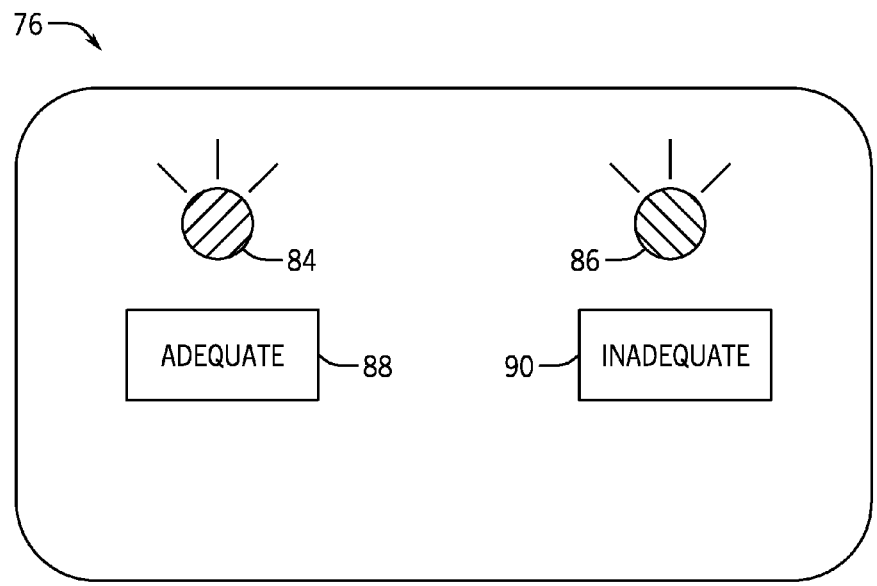
FIG. 9 illustrates a display of a utility meter having two indicators, in accordance with embodiments presented herewith.

FIG. 9 shows one embodiment of the display 76 that may generate the visualization regarding the contact force value. The display 76 in FIG. 9 includes two indicators 84, 86. In certain embodiments, the first indicator 84 may illuminate when the contact-force value is at or above a value. The value may be set at a point where the contact force between the socket jaws 20, 22 and the terminals 24, 26 of the utility meter 10 is sufficient to ensure that electrical current will flow through the utility meter 10 from the utility supply line 14 to the load line 16. In certain embodiments, the value may be the same or different from the threshold value used by the processor to determine whether or not to send the signal to change the position of the service switch. For example, the value may be approximately 225 N.

When the contact-force value is less than the specified value, the second indicator 86 may illuminate. In certain embodiments, the first indicator 84 may be a green light-emitting diode (LED). In certain embodiments, the second indicator 86 may be a red LED. In other embodiments, the first indicator 84 and the second indicator 86 may include illumination devices of any color. Also, in some embodiments, the first indicator 84 and the second indicator 86 may have labels 88, 90 beneath them, which further signal to an observer that the contact force is either "ADEQUATE" 88 or "INADEQUATE" 90.

Figure 10:
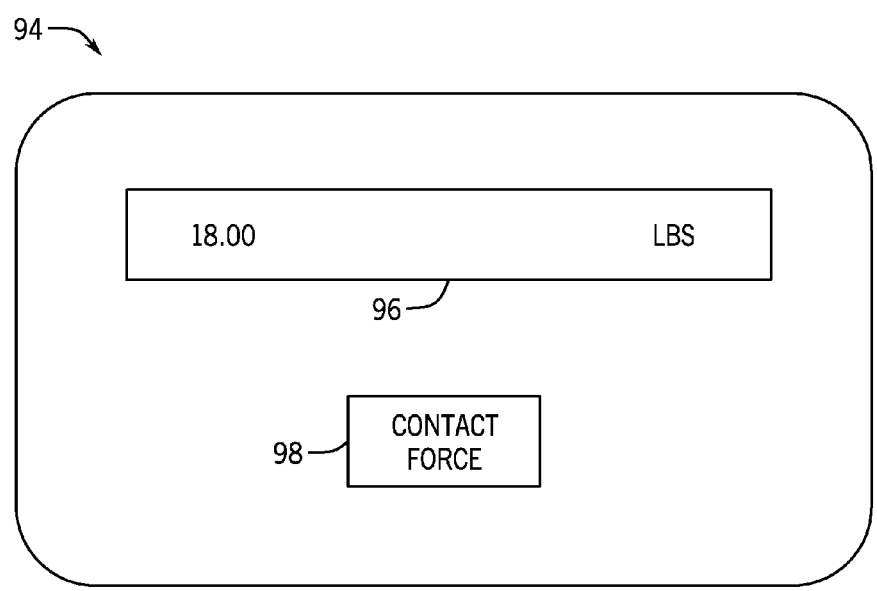
FIG. 10 illustrates another display of the utility meter having a digital display, in accordance with embodiments presented herewith.

Alternatively, FIG. 10 shows another embodiment of a display 94 of the utility meter 10. As opposed to utilizing indicators 84, 86, the display 94 may include a digital display 96 of the contact force value received from the force sensing unit 38 or other device configured to measure the force between the socket jaws 20, 22 and the terminals 24, 26 of the utility meter 10. Also, in some embodiments, the digital display 96 may have a label 98 beneath it, which clarifies to an observer what value is being displayed or measured. For example, FIG. 10 illustrates that the "CONTACT FORCE" 98 is being shown. It should be appreciated by those with skill in the art that, in certain embodiments, the display 94 may include an analog display of the contact force or the conductance of the piezoresistive force sensor in lieu of, or in addition to, the digital display 96.

Additionally, an alternative embodiment may have a combination of both the display 76 and the display 94. In such an embodiment, a display may contain the first indicator 84 and the second indicator 86 as well as the digital display 96. Additionally, in some embodiments, the first indicator 84, the second indicator 86, the digital display 96, or a combination of the three may include the labels 88, 90, 98 beneath it.

In certain embodiments, instead of disposing a force sensing unit 38 on the first half 30 of the terminals 24, 26 of the utility meter 10, a separate test device may be used to test the contact force of the socket jaws 20, 22 (e.g., when the utility meter 10 is not secured in the meter socket 12 as illustrated in FIG. 5, for example). The test device may include the force sensing unit 38 disposed on, or between two halves of, a member, or members. The member or members may be approximately the same size as the terminals 24, 26 of the utility meter 10, such that the member or members may fit between the blades of the socket jaws 20, 22 in a similar manner to the utility meter terminals 24, 26. The test device may be inserted between the blades of the socket jaws 20, 22 to assess the contact force that may occur if the utility meter 10 were secured in the meter socket 12.

The force sensing unit 38 of the test device may measure a contact force between the blades of the socket jaws 20, 22 and a member, or members, of the test device. In certain embodiments, the test device may include more than one member such that it may measure the contact force between the blades of the socket jaws 20, 22 and the more than one members simultaneously.

In certain embodiments, the test device may also include a processor 54 and the corresponding displays 76, 94 as discussed with the embodiments recited above. The test device may be utilized by a serviceman or a customer of the utility supply company to assess whether the contact force between the utility meter and the utility is adequate.

This written description recites examples of embodiments of the present disclosure, including the best mode, and also to enable any person skilled in the art to practice the invention, including making and using any devices or systems and performing any incorporated methods. The patentable scope of the present disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A system configured to measure an amount of electricity being consumed by a load, comprising:
   a utility meter comprising a first terminal, wherein the first terminal comprises a first half and a second half;
   a socket jaw, comprising:
      a first blade;
      a second blade, wherein the first blade and the second blade are configured to receive the first terminal;
   a force sensing unit disposed between the first half and the second half of the first terminal, wherein the force sensing unit is configured to measure a contact force between the first blade and the first terminal; and,
   a service switch configured to disconnect a flow of electricity through the utility meter when the contact force is less than a predetermined value.

2. The system of claim 1, wherein the predetermined value is approximately 225 Newtons ("N").

3. The system of claim 1, wherein the force sensing unit comprises a piezoresistive force sensor.

4. The system of claim 1 wherein the service switch is a relay.

* * * * *